(12) United States Patent
Castro et al.

(10) Patent No.: US 10,717,641 B2
(45) Date of Patent: Jul. 21, 2020

(54) COVER BASED ADHESION FORCE MEASUREMENT SYSTEM FOR MICROELECTROMECHANICAL SYSTEM (MEMS)

(71) Applicant: InvenSense, Inc., San Jose, CA (US)

(72) Inventors: Alexander Castro, San Francisco, CA (US); Chae Ahn, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 227 days.

(21) Appl. No.: 15/846,990

(22) Filed: Dec. 19, 2017

(65) Prior Publication Data

US 2019/0062147 A1 Feb. 28, 2019

Related U.S. Application Data

(60) Provisional application No. 62/552,306, filed on Aug. 30, 2017.

(51) Int. Cl.
| | |
|---|---|
| *B81B 3/00* | (2006.01) |
| *B81B 7/00* | (2006.01) |
| *G01L 1/10* | (2006.01) |
| *B81C 99/00* | (2010.01) |

(52) U.S. Cl.
CPC ............ *B81B 3/0032* (2013.01); *B81B 3/001* (2013.01); *B81B 7/0006* (2013.01); *B81B 7/008* (2013.01); *B81B 7/0045* (2013.01); *B81C 99/0045* (2013.01); *G01L 1/10* (2013.01)

(58) Field of Classification Search
CPC ..... B81B 3/0032; B81B 3/001; B81B 7/0006; B81B 7/0045; B81B 7/008; B81C 99/0045

See application file for complete search history.

(56) References Cited

U.S. PATENT DOCUMENTS

| | | | | |
|---|---|---|---|---|
| 7,050,320 B1 * | 5/2006 | Lai | ......................... | B82Y 10/00 257/414 |
| 2004/0113727 A1 * | 6/2004 | Kawai | ................ | H01H 59/0009 335/78 |
| 2013/0307096 A1 * | 11/2013 | Classen | ................... | B81B 7/008 257/418 |
| 2016/0037265 A1 * | 2/2016 | Khenkin | ................ | H04R 19/04 381/174 |

* cited by examiner

*Primary Examiner* — Suman K Nath

(57) ABSTRACT

In some embodiments, a sensor includes a microelectromechanical system (MEMS) structure, a cover, and a bump stop. The MEMS structure is configured to move responsive to electromechanical stimuli. The cover is positioned on the MEMS structure. The cover is configured to mechanically protect the MEMS structure. The bump stop is disposed on a substrate and the bump stop is configured to stop the MEMS structure from moving beyond a certain point. The bump stop is further configured to stop the MEMS structure from making physical contact with the substrate. Moreover, the cover is configured to apply a force to the MEMS structure responsive to a voltage being applied to the cover.

18 Claims, 11 Drawing Sheets

COVER BASED ADHESION FORCE MEASUREMENT SYSTEM FOR MICROELECTROMECHANICAL SYSTEM (MEMS)

RELATED

This application claims the benefit and priority to the U.S. Provisional Patent Application No. 62/552,306, filed on Aug. 30, 2017, which is hereby incorporated by reference in its entirety.

BACKGROUND

Many electronic devices utilize sensors for various applications, e.g., detecting motion, detecting finger print, detecting acceleration, etc. Some sensors use a microelectromechanical system (MEMS). In MEMS technology, sometimes the surface adhesion force between the MEMS structure contacting another component, e.g., bump stop, is greater than a restoring force to release the MEMS structure from the component it is in contact with. Surface adhesion force being greater than the restoring force is known as stiction and it is undesirable.

SUMMARY

Accordingly, a need has arisen to test for stiction in order to determine whether the MEMS device should be discarded or whether it can be used. Moreover, a need has arisen to test for stiction without taking up real estate on the substrate. Furthermore, a need has arisen to test for stiction using substantially the existing components of the sensor.

In some embodiments, a sensor includes a microelectromechanical system (MEMS) structure, a cover, and a bump stop. The MEMS structure is configured to move responsive to electromechanical stimuli. The cover is positioned on the MEMS structure. The cover is configured to mechanically protect the MEMS structure. The bump stop is disposed on a substrate and the bump stop is configured to stop the MEMS structure from moving beyond a certain point. The bump stop is further configured to stop the MEMS structure from making physical contact with the substrate. Moreover, the cover is configured to apply a force to the MEMS structure responsive to a voltage being applied to the cover.

The sensor may further include a processor configured to measure adhesion force between the MEMS structure and the bump stop when the MEMS structure makes contact with the bump stop and not released. The adhesion force is measured responsive to the voltage being applied and by measuring output of the sensor. It is appreciated that the MEMS structure is released from being in contact with the bump stop when a magnitude of the voltage is decreased to overcome the adhesion force or when a polarity of the voltage is reversed. The applied voltage ranges between 5 V to 100 V. The sensor may include a wire bond connected to an electrical connection on an exterior of the cover and the voltage may be applied to the cover via the wire bond. It is appreciated that in some embodiments the electrical connection is positioned on a horizontal surface of the cover. In some embodiments, the electrical connection is positioned on a vertical surface of the cover.

It is appreciated that in some embodiments the sensor includes a circuitry disposed on an interior of the cover facing the MEMS structure to apply the voltage. The circuitry may include a charge pump.

In some embodiments, the sensor may include vias disposed within the cover. The vias are configured to electrically connect the voltage being applied to an exterior of the cover to an electrode within an interior portion of the cover.

These and other features and aspects of the concepts described herein may be better understood with reference to the following drawings, description, and appended claims.

DETAILED DESCRIPTION

Figure 1A:
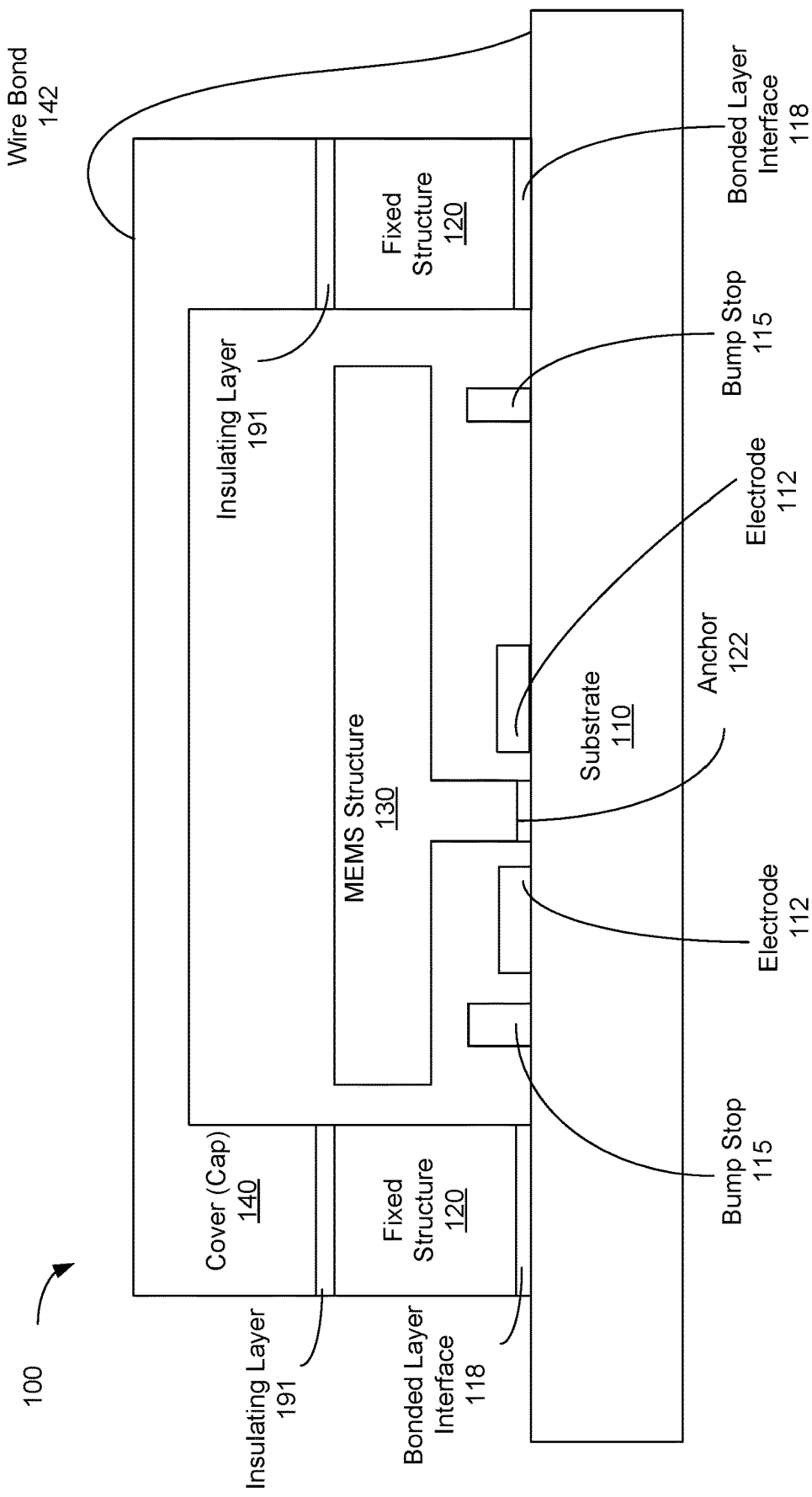
FIGS. 1A-1B show a sensor before and after applying a voltage in accordance with some embodiments.

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "forward," "reverse," "clockwise," "counter clockwise," "up," "down," or other similar terms such as "upper," "lower," "above," "below," "vertical," "horizontal," "proximal," "distal,"

"interior," "exterior," "external", "internal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

Stiction occurs when the surface adhesion force between the microelectromechanical system (MEMS) structure and another component, e.g., stop bump, is greater than the restoring force. A need has arisen to test for stiction in order to test the MEMS device and its quality. The MEMS device may be discarded if stiction occurs at an unacceptable rate. Moreover, a need has arisen to test for stiction without taking up real estate on the substrate by using substantially the existing components of the sensor.

In some embodiments, a sensor includes a microelectromechanical system (MEMS) structure, a cover, and a bump stop. The MEMS structure is configured to move responsive to electromechanical stimuli. The cover is positioned on the MEMS structure. The cover is configured to mechanically protect the MEMS structure. The bump stop is disposed on a substrate and the bump stop is configured to stop the MEMS structure from moving beyond a certain point. The bump stop is further configured to stop the MEMS structure from making physical contact with the substrate. Moreover, the cover is configured to apply a force to the MEMS structure responsive to a voltage being applied to the cover.

In some embodiments, the voltage is applied to an exterior of the cover and is increased. The MEMS structure moves responsive to the applied voltage and makes physical contact with the bump stop. The output of the sensor is measured as the voltage is being applied. In some embodiments, increasing the voltage is stopped and the voltage is decreased once the output of the sensor remains substantially constant. The output of the sensor is monitored and measured as the voltage is decreased. The MEMS structure ultimately moves responsive to the decreasing voltage and is released from being in physical contact with the bump stop. The adhesion force between the MEMS structure and the bump stop is determined based on the measured output of the sensor.

Figure 1B:
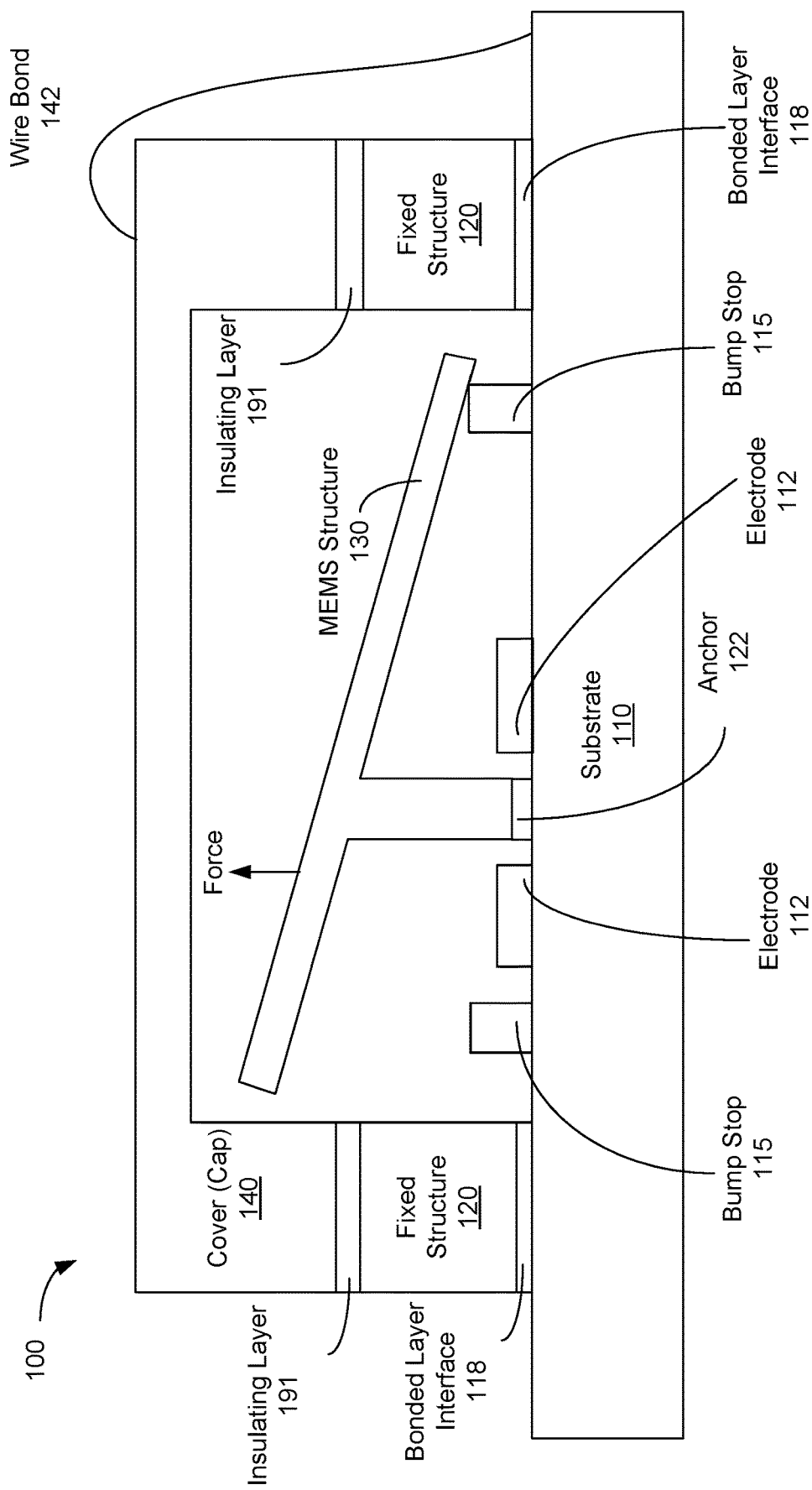

Referring now to FIGS. 1A-1B, a sensor before and after applying a voltage in accordance with some embodiments is shown. Referring specifically to FIG. 1A, a sensor 100 in accordance with some embodiments is shown. The sensor 100 may include a substrate 110, a fixed structure 120, a MEMS structure 130, and a cover (cap) 140.

The substrate 110 may be a CMOS. A fixed structure 120 may be disposed over the substrate 110. In some embodiments, the fixed structure 120 may be bonded to the substrate 110 using a bonded layer interface 118. For example, the fixed structure 120 may be eutecticly bonded to the substrate 110. A MEMS structure 130 may be disposed over an anchor 122 which is disposed over the substrate 110. The anchor 122 enables the MEMS structure 130 to move. It is appreciated that the MEMS structure 130 may be coupled to the anchor 122 through various means, e.g., eutectic bonding, etc. The cover 140 is coupled to the fixed structure 120 and is configured to mechanically protect the MEMS structure 130. The cover 140 may also be referred to as a cap and vice versa. It is appreciated that the cover 140 may be coupled to the fixed structure 120 via an insulating layer 191, e.g., oxide layer. It is appreciated that the fixed structure 120 and the MEMS structure 130 may be referred to as a device layer and the cover 140 may be referred to as the handle layer. The cover 140 may be coupled to the device layer by a fusion bond, e.g., oxide layer.

The MEMS structure 130 is configured to move in response to electromechanical stimuli. For example, the MEMS structure 130 may move in response to a change in pressure, acceleration, gyro motion, etc. It is appreciated that the MEMS structure 130 may also move responsive to electrical stimuli such as a voltage application. In other embodiments, the MEMS structure 130 may move responsive to force such as electromagnetic force.

It is appreciated that in some embodiments, electrodes 112 may be disposed on the substrate 110. The electrodes 112 may sense the MEMS structure 130 moving, e.g., capacitance value changing in response to the MEMS structure 130 moving. In some embodiments, a bump stops 115 may be disposed over the substrate 110. The bump stops 115 is configured to stop the MEMS structure 130 from making physical contact with various components on the substrate 110. For example, the bump stops 115 may be configured to stop the MEMS structure 130 from making physical contact with the substrate 110 itself and/or electrodes 112. Stiction occurs when the surface adhesion force between the MEMS structure 130 and another component, e.g., stop bump 115, is greater than the restoring force.

In order to determine whether stiction occurs, during testing, the MEMS structure 130 is moved to make physical contact with the bump stops 115 or other fixed structures, e.g., substrate 110. In some embodiments, in order to move the MEMS structure 130, a force is applied. According to some embodiments, a voltage is applied to the exterior of the cover 140 in order to move the MEMS structure 130. A voltage is applied through a wire bond 142 in some embodiments that creates a force in moving the MEMS structure 130, as shown in FIG. 1B. The wire bond 142 is connected to the horizontal portion of the cover 140. The applied voltage is typically large and ranges from 0 V to 100 V. More specifically, the voltage ranges from 5 V to 100 V. The voltage is supplied from the substrate 110 outside of the footprint of the fixed structure 120, MEMS structure 130, and the cover 140 in order to avoid utilizing valuable real estate within the MEMS enclosure. The cover 140 may be conductive, e.g., composed of Aluminum, or it may include electrodes where the voltage is applied.

In some embodiments, the voltage is applied to an exterior of the cover 140 and is increased, e.g., increased from 0 V to 100 V. The MEMS structure 130 moves responsive to the applied voltage and makes physical contact with the bump stops 115. The output of the sensor is measured as the voltage is being applied from 0 V to 100 V. In some embodiments, the voltage is no longer increased when the output of the sensor remains substantially constant. Subsequently, the voltage is decreased, e.g., from 100 V to 0 V. The output of the sensor is monitored and measured as the voltage is increased and subsequently decreased. The MEMS structure 130 ultimately moves responsive to the decreasing voltage and is released from being in physical contact with the bump stops 115. The adhesion force between the MEMS structure 130 and the bump stops 115 is determined based on the measured output of the sensor.

Figure 8:
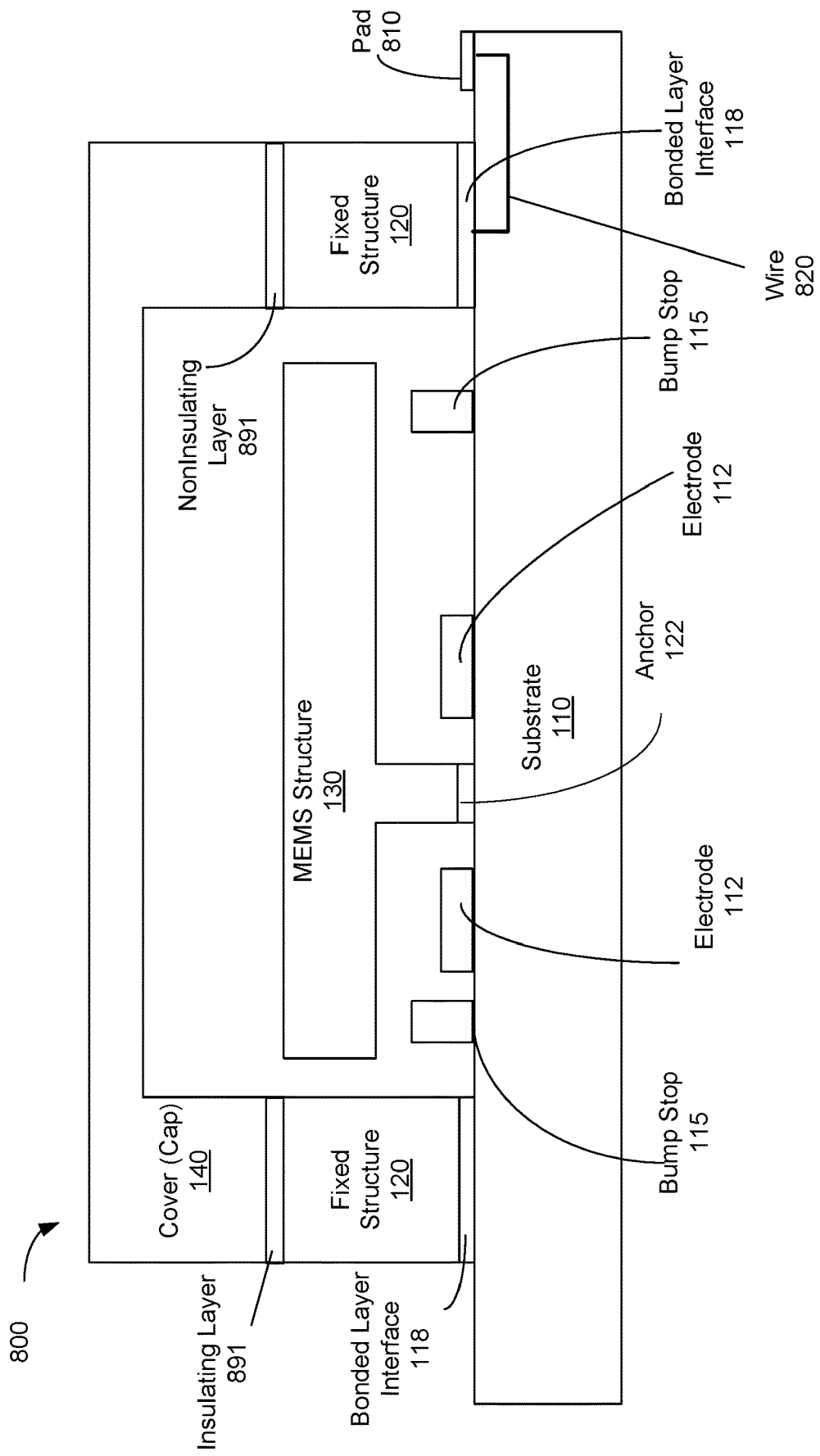
FIG. 8 shows a sensor with a bond pad for applying a voltage in accordance with some embodiments.
Figure 9:
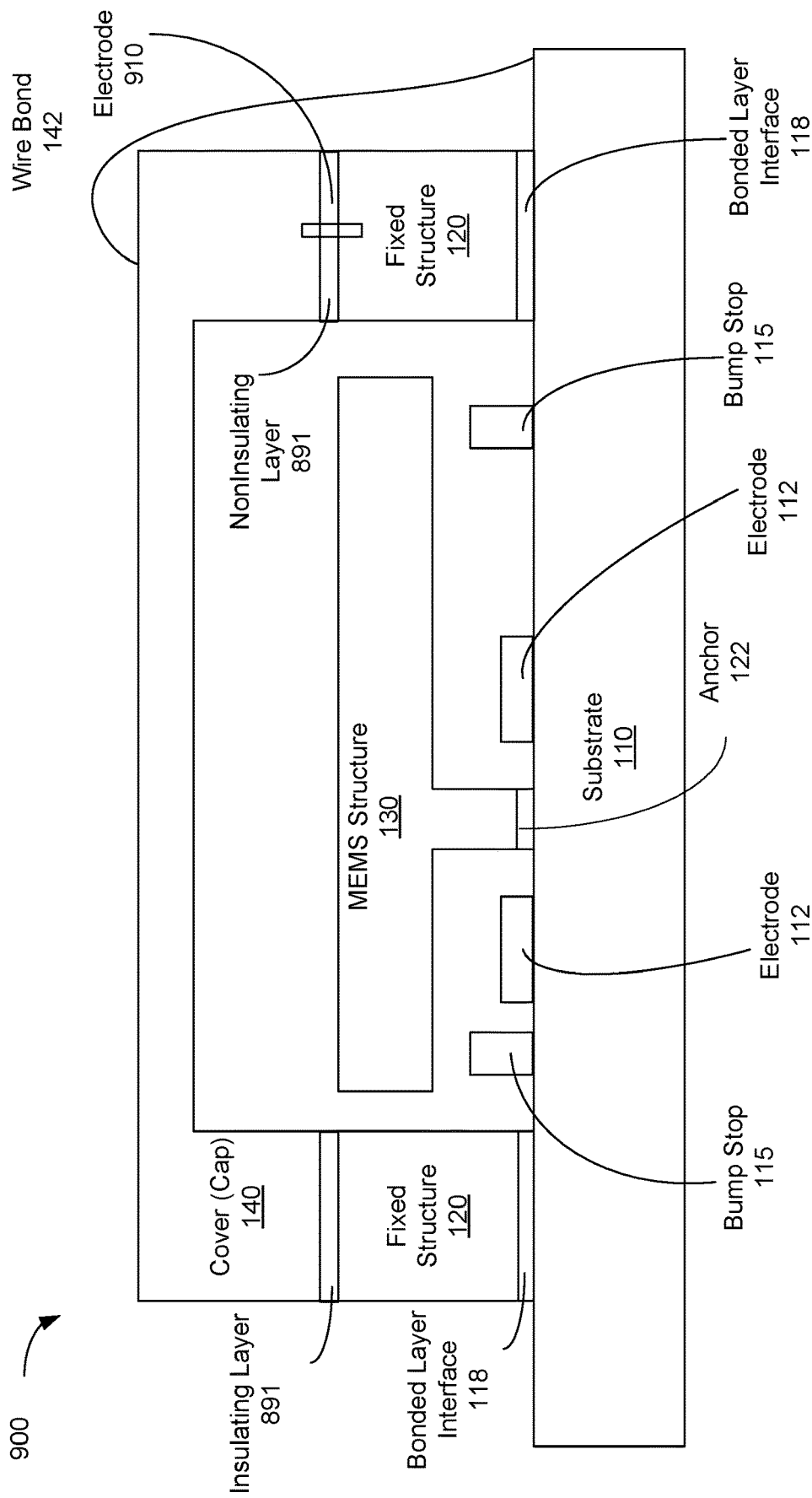
FIG. 9 shows a sensor with an electrode for electrically coupling the cover to the fixed structure in accordance with some embodiments.

It is appreciated that while an insulating layer 191 is illustrated in some embodiments a non-insulating layer may be used. In embodiments where a non-insulating layer is used, the voltage may be applied to the bonded layer interface 118 or through other means as illustrated in FIGS. 8 and 9 below.

Figure 2:
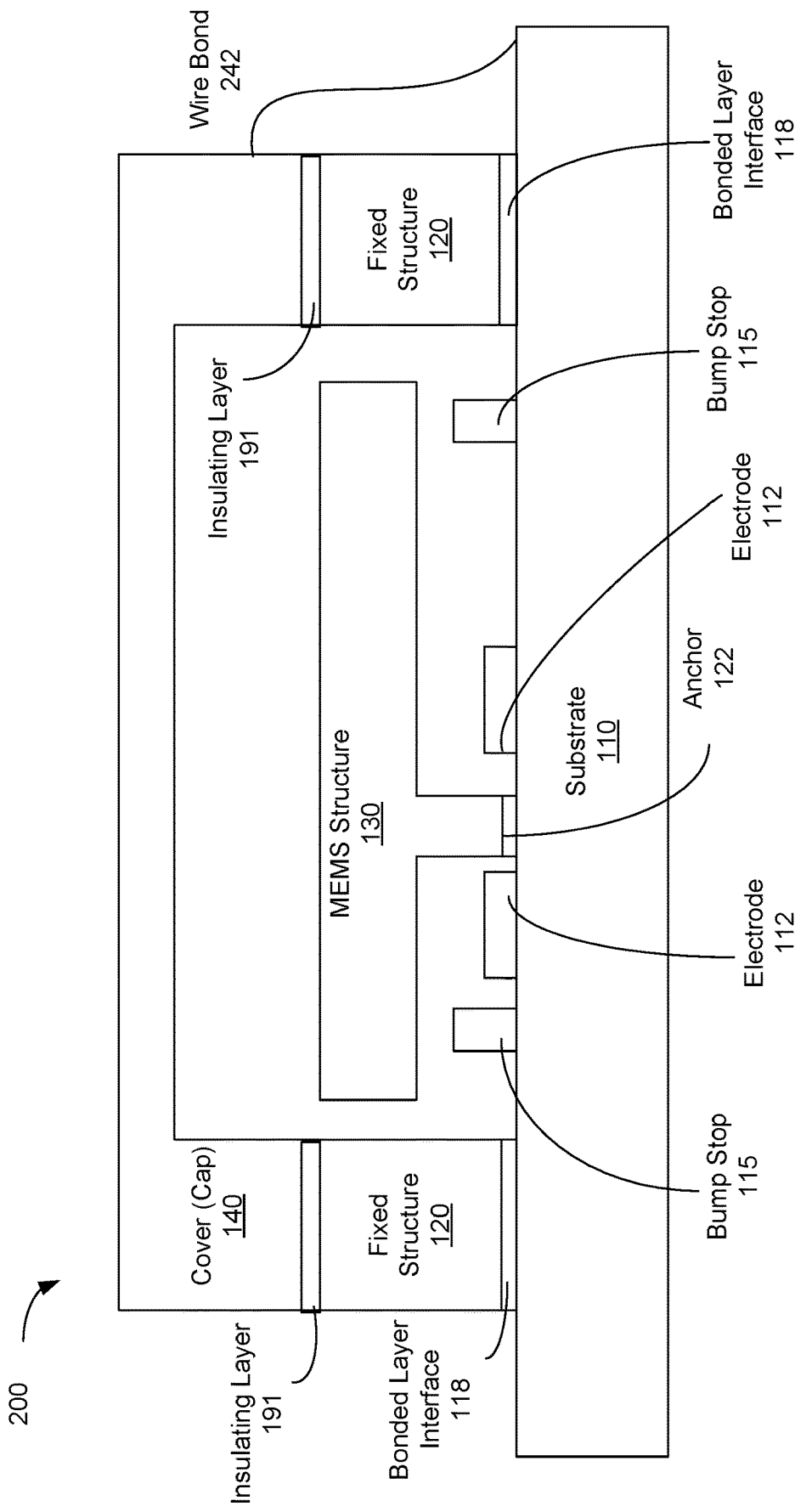
FIG. 2 shows a sensor with a wire bond connection to a vertical portion of the cover for applying a voltage to the cover in accordance with some embodiments.

Referring now to FIG. 2, a sensor 200 with a wire bond connection to a vertical portion of the cover for applying a voltage to the cover in accordance with some embodiments is shown. Sensor 200 is substantially similar to that of FIGS. 1A and 1B. In this embodiment, the wire bond 242 to apply the voltage is connected to the vertical portion of the cover 140. It is appreciated that position at which the voltage is applied may create a force in a different direction.

Figure 3:
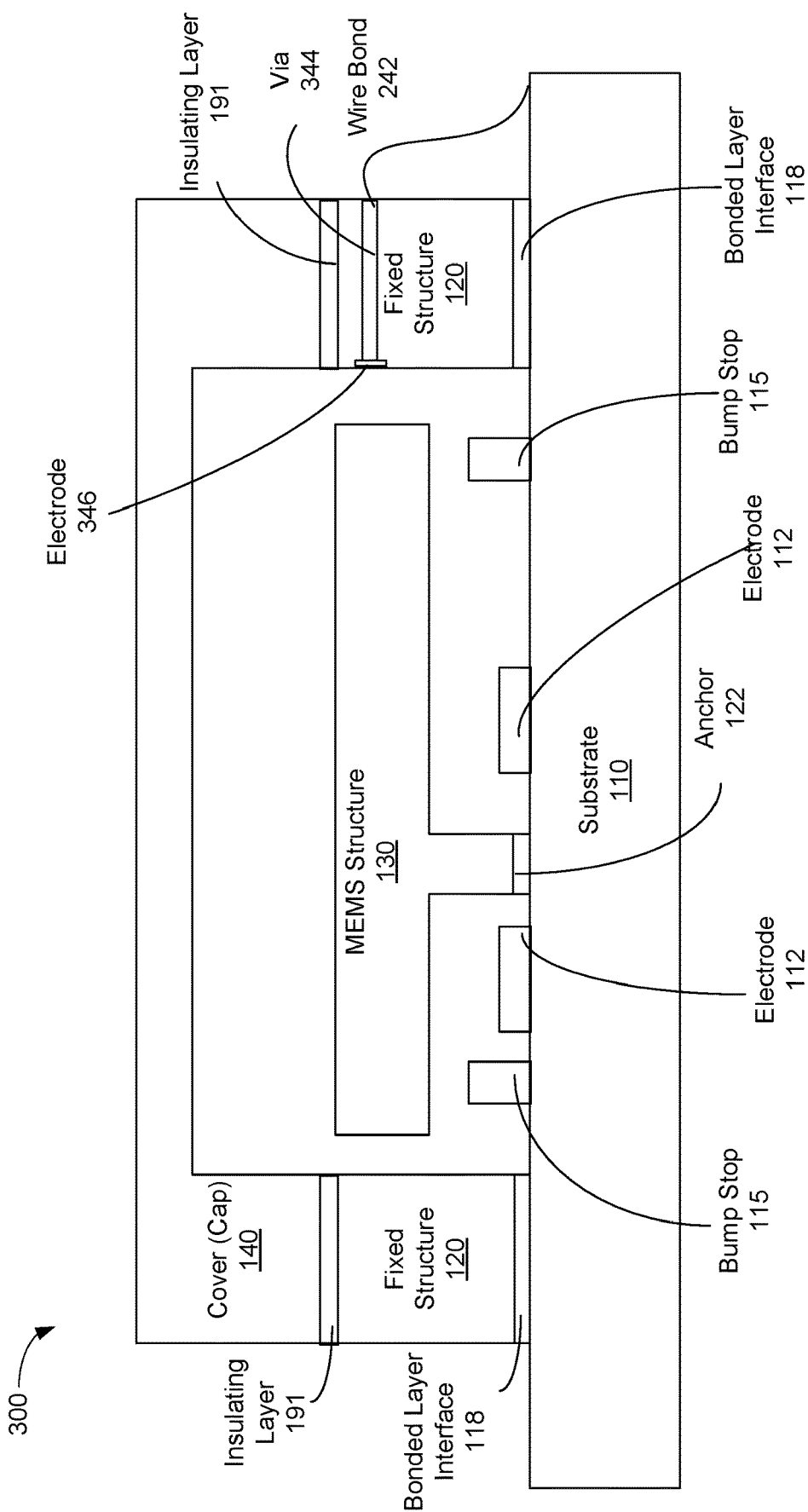
FIG. 3 shows a sensor with a horizontal vias for applying a voltage to the interior of the cover in accordance with some embodiments.

Referring now to FIG. 3, a sensor 300 with a horizontal via for applying a voltage to the interior of the cover in accordance with some embodiments is shown. Sensor 300 is substantially similar to that of FIG. 2. In this embodiment, the wire bond 242 is connected to the vertical portion of the cover 140. Via 344 electrically connects the wire bond 242 to the electrode 346 disposed on a vertical interior surface of the cover 140. The electrode 346 in presence of a voltage may apply a force on the MEMS structure 130.

Figure 4:
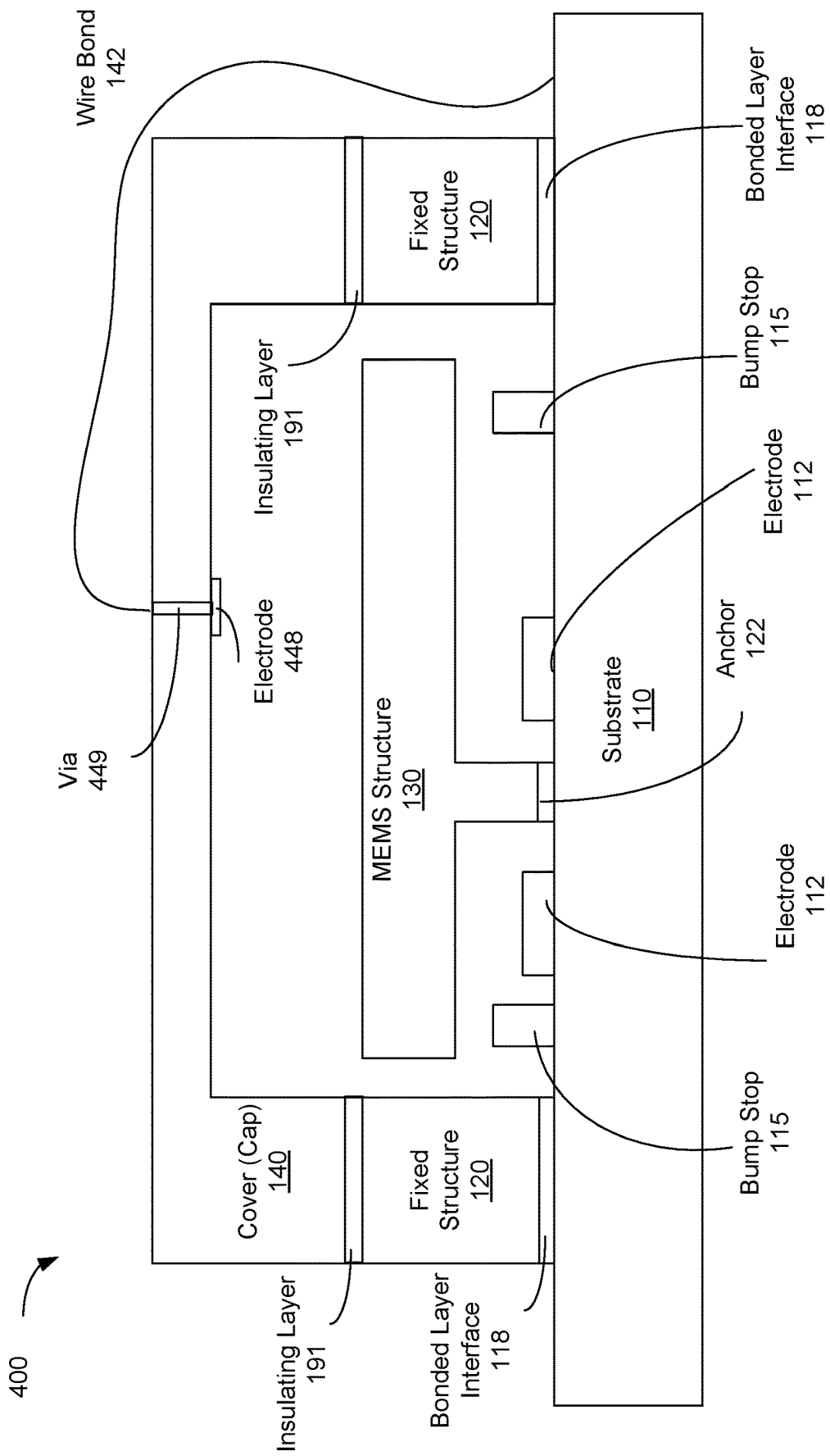
FIG. 4 shows a sensor with a wire bond connecting to vertical vias on the cover for applying voltage in accordance with some embodiments.

Referring now to FIG. 4, a sensor 400 with a wire bond connecting to vertical vias on the cover for applying voltage in accordance with some embodiments is shown. Sensor 400 is substantially similar to that of FIG. 3. In this embodiment, the wire bond 142 is connected to the horizontal portion of the cover 140. Via 449 electrically connects the wire bond 142 to the electrode 448 disposed on a horizontal interior surface of the cover 140. The electrode 448 in presence of a voltage may apply a force on the MEMS structure 130 (similar to the force in FIG. 1B).

It is appreciated that applying the voltage to the vertical and/or horizontal surface of the cover 140 is exemplary and not intended to limit the scope of the embodiments. For example, a combination of voltage application to both the vertical and the horizontal surface of the cover 140 may also be used.

Figure 5:
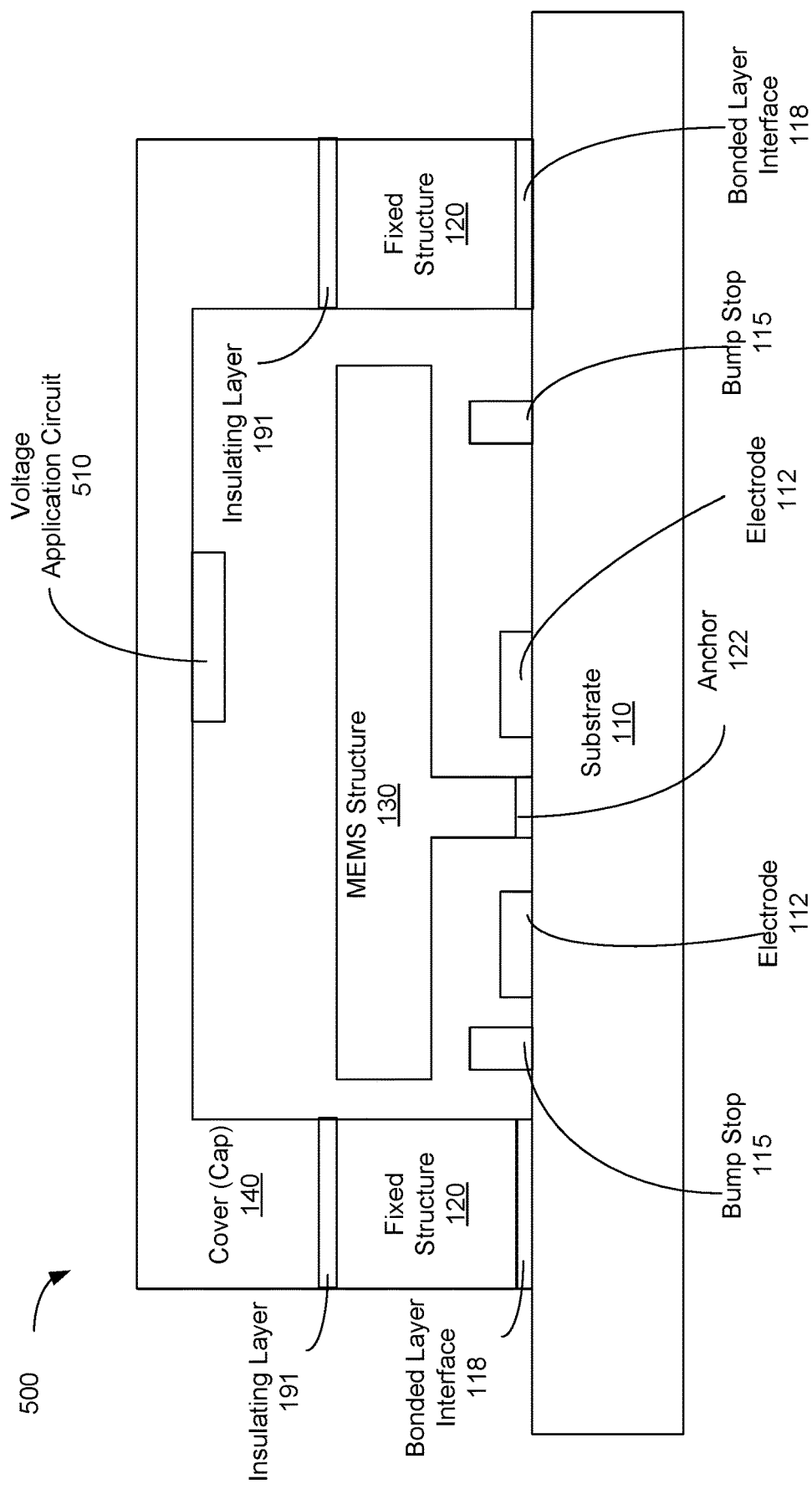
FIG. 5 shows a sensor with a voltage application circuitry disposed on the interior surface of the cover in accordance with some embodiments.

Referring now to FIG. 5, a sensor 500 with a voltage application circuitry disposed on the interior surface of the cover in accordance with some embodiments is shown. Sensor 500 is substantially similar to that of FIGS. 1A and 1B except that in this embodiment no voltage is applied through a wire bond. In this embodiment, the voltage application circuit 510 disposed on a horizontal interior surface of the cover 140 may apply the voltage to create a force. The voltage application circuit 510 may include a charge pump to provide a high voltage. It is appreciated that the voltage application circuit 510 is disposed on an interior wall of the cover 140 in order to avoid taking value footprint of the substrate 110 within the enclosure of the MEMS (the enclosure includes the interior of the substrate 110 that is enclosed by the cover 140, the fixed structure 120, and the MEMS structure 130). It is appreciated that while the voltage application circuit 510 is illustrated as being positioned on the horizontal interior wall of the cover 140, it may be positioned anywhere on the interior wall of the cover 140, e.g., interior vertical wall.

Figure 6:
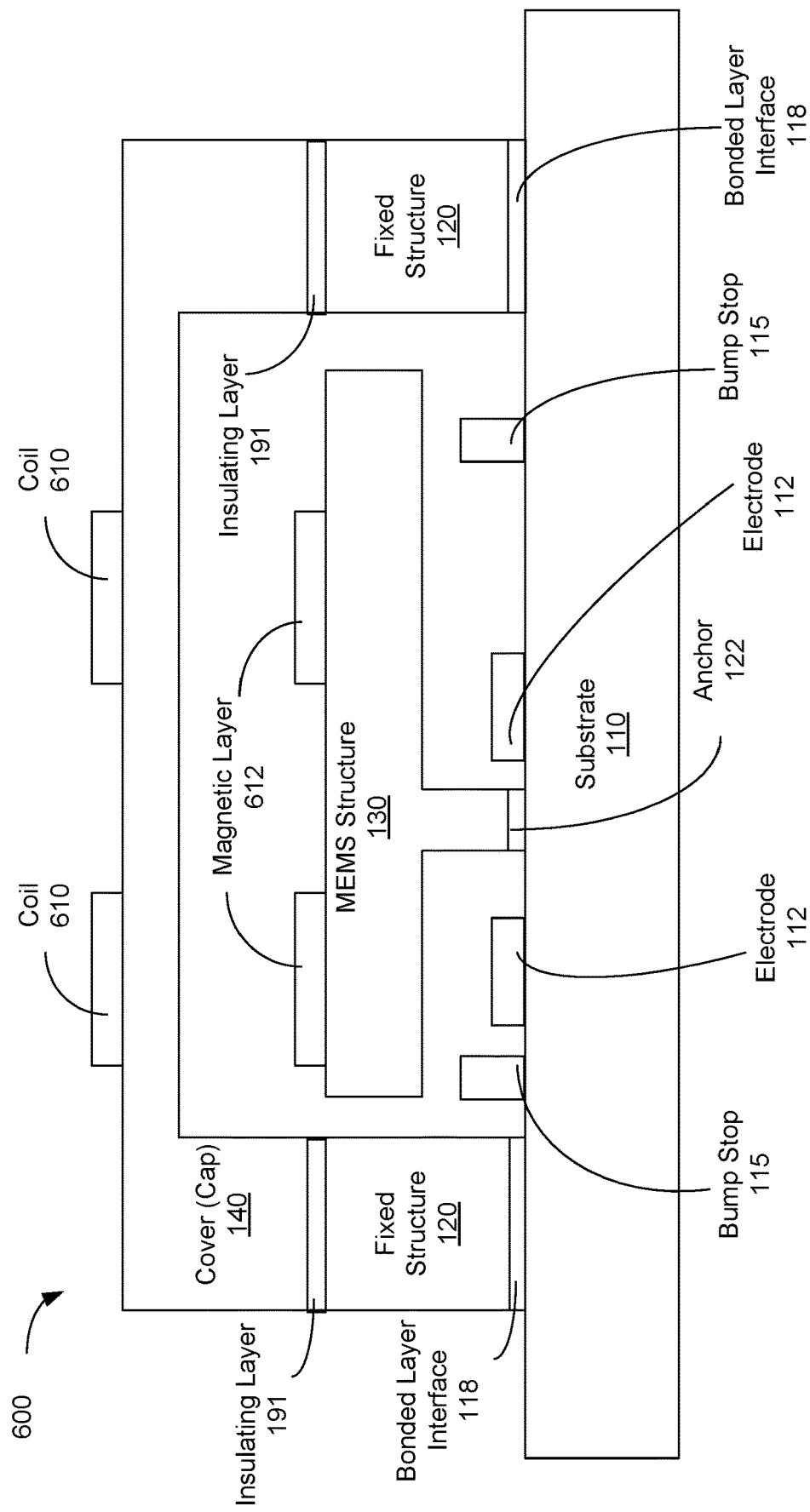
FIG. 6 shows a sensor with electromagnetic force for applying force to the MEMS structure in accordance with some embodiments.

Referring now to FIG. 6, a sensor 600 with electromagnetic force for applying force to the MEMS structure in accordance with some embodiments is shown. Sensor 600 is similar to that of FIG. 5 except that instead of using the voltage application circuit 510, a coil 610 may be used to generate the necessary force. For example, magnetic layer 612 may be disposed on the MEMS structure 130 and the coil 610 positioned on an exterior of the cover 140, in presence of a current, may generate electromagnetic force that moves the MEMS structure 130. It is appreciated that in this embodiment, the electromagnetic force created by the coil 610 interacting with the magnetic layer 612 moves the MEMS structure 130. As such, the MEMS structure 130 makes physical contact with the bump stops 115. The output of the sensor is measured as the force is increased. It is appreciated that in some embodiments, the force applied may be correlated to the current through the coil 610. In other words, the output of the sensor may be monitored and measured as the current through the coil 610 is increased. In some embodiments, the current through the coil 610 is no longer increased when the output of the sensor remains substantially constant. Subsequently, the current is decreased. The output of the sensor is monitored and measured as the current is increased and subsequently decreased. The MEMS structure 130 ultimately moves responsive to the decreasing current and is released from being in physical contact with the bump stops 115. The adhesion force between the MEMS structure 130 and the bump stops 115 is determined based on the measured output of the sensor.

Figure 7:
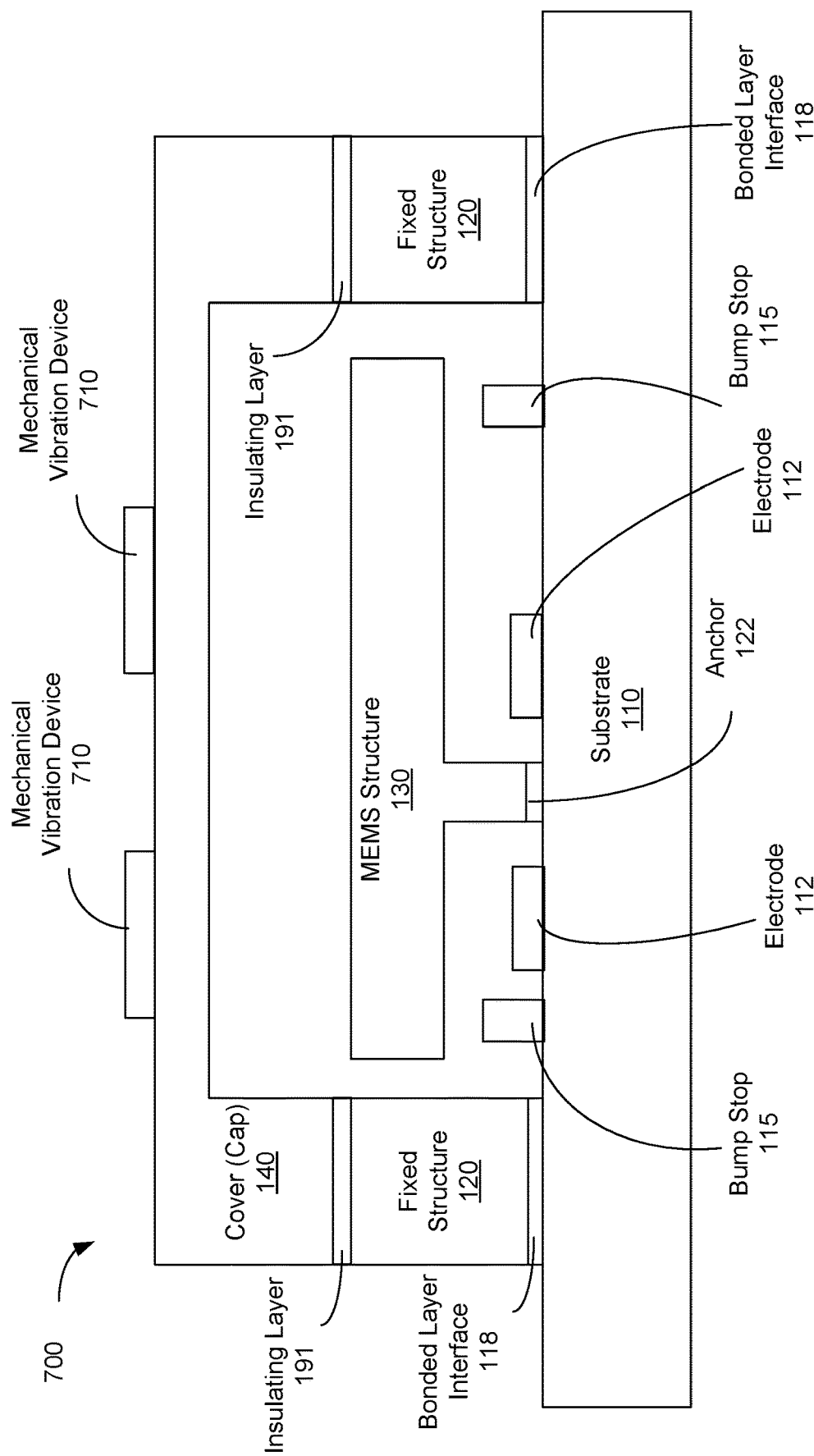
FIG. 7 shows a sensor with a mechanical vibration component for applying force to the MEMS structure in accordance with some embodiments.

Referring now to FIG. 7, a sensor 700 with a mechanical vibration component for applying force to the MEMS structure in accordance with some embodiments is shown. Sensor 700 is similar to sensor 600 except that the force is created using a mechanical vibration device 710 instead of using coil 610 to create electromagnetic force. It is appreciated that in this embodiment, the force is created by the mechanical vibration device 710 that moves the MEMS structure 130. In an embodiment, force can be applied at one location or multiple locations or can be applied symmetrically on either sides of the MEMS structure. As such, the MEMS structure 130 makes physical contact with the bump stops 115. The output of the sensor is measured as the force is increased. In some embodiments, the force is no longer increased when the output of the sensor remains substantially constant. Subsequently, the force is decreased. The output of the sensor is monitored and measured as the force is increased and subsequently decreased. The MEMS structure 130 ultimately moves responsive to the decreasing force and is released from being in physical contact with the bump stops 115. The adhesion force between the MEMS structure 130 and the bump stops 115 is determined based on the measured output of the sensor.

Referring now to FIG. 8, a sensor 800 with a pad to apply a voltage in accordance with some embodiments is shown. Sensor 800 is similar to the sensors in FIGS. 1A-7. However, in this embodiment, the cap 140 is coupled to the fixed structure 120 via a non-insulating layer 891. As such, the voltage may be applied through a different mean than applying it to the cover 140. For example, the voltage may be applied to the pad 810 that is electrically connected to the bonded layer interface 118 via a wire 820. In such an embodiment, fixed structure 120 functions as an electrode.

Referring now to FIG. 9, a sensor 900 with an electrode that electrically connects the cover 140 to the fixed structure 120 in accordance with some embodiments is shown. Sensor 900 is similar to the sensors in FIGS. 1A-7. However, in this embodiment, the cap 140 is coupled to the fixed structure 120 via a non-insulating layer 891, as discussed in FIG. 8. As such, the voltage may be applied through the cover 140 and electrically coupled to the fixed structure 120 via the electrode 910.

Figure 10:
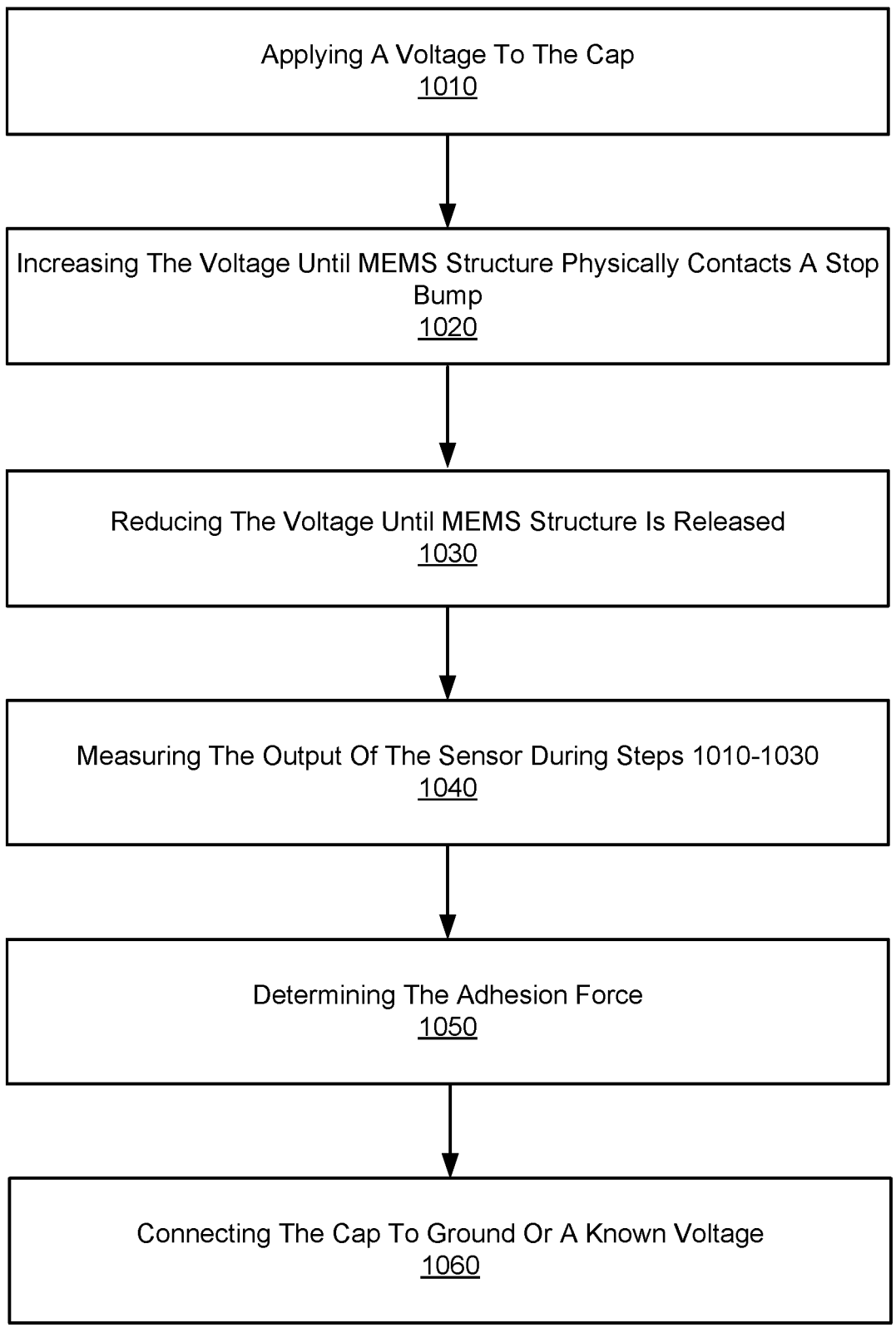
FIG. 10 shows an exemplary flow diagram for measuring adhesion force in accordance with some embodiments.

Referring now to FIG. 10, an exemplary flow diagram for measuring adhesion force in accordance with some embodiments is shown. At step 1010, a force is applied, for example by applying voltage to an exterior of the cover. At step 1020, the force is increased for example by increasing the applied voltage. The MEMS structure moves responsive to the increasing voltage and makes physical contact with the bump stop. The output of the sensor is measured as the voltage is being applied. At step 1030, the force is decreased by for example reducing the voltage. It is appreciated that the voltage is decreased when the output of the sensor remains substantially constant for increase in voltage. The output of the sensor is monitored and measured as the voltage is decreased. The MEMS structure ultimately moves responsive to the decreasing voltage and is released from being in physical contact with the bump stop. At step 1040, the output of the sensor is measured and monitored for increasing/decreasing forces, e.g., increasing/decreasing voltage. At step 1050, the adhesion force between the MEMS structure and the bump stop is determined based on the measured output of the sensor.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A sensor comprising:
   a microelectromechanical system (MEMS) structure anchored to a substrate, wherein the MEMS structure is configured to move responsive to electromechanical stimuli;
   electrodes on the substrate configured for sensing MEMS structure motion by changing capacitance value in response thereto;
   a cover positioned over the MEMS structure, wherein the cover is configured to mechanically protect the MEMS structure; and
   a bump stop disposed on the substrate wherein the bump stop is configured to stop the MEMS structure from moving beyond a certain point and further configured to stop the MEMS structure from making physical contact with the substrate, wherein the cover is positioned opposite to the substrate with respect to the MEMS structure
   and wherein the cover is configured to apply a force to the MEMS structure responsive to a voltage being applied to the cover, and wherein the MEMS structure is configured to contact the bump stop and wherein the MEMS structure and the cover make no contact; and
   a processor configured to measure adhesion force between the MEMS structure and the bump stop when the MEMS structure makes contact with the bump stop and not released, wherein the adhesion force is measured responsive to the voltage being applied and by measuring capacitance value through the electrodes.

2. The sensor as described in claim 1, wherein the MEMS structure is released from being in contact with the bump stop when a magnitude of the voltage is decreased to overcome the adhesion force or when a polarity of the voltage is reversed.

3. The sensor as described in claim 1, wherein the applied voltage ranges between 5 V to 75 V.

4. The sensor as described in claim 1 further comprising a wire bond connected to an electrical connection on an exterior of the cover, wherein the voltage is applied to the cover via the wire bond.

5. The sensor as described in claim 4, wherein the electrical connection is positioned on a horizontal surface of the cover.

6. The sensor as described in claim 4, wherein the electrical connection is positioned on a vertical surface of the cover.

7. The sensor as described in claim 1 further comprising:
   a circuitry disposed on an interior of the cover facing the MEMS structure, wherein the circuitry is configured to apply the voltage.

8. The sensor as described in claim 7, wherein the circuitry comprises a charge pump.

9. The sensor as described in claim 1 further comprising vias disposed within the cover, wherein the vias are configured to electrically connect the voltage being applied to an exterior of the cover to an electrode within an interior portion of the cover.

10. A sensor comprising:
    a microelectromechanical system (MEMS) structure configured to move responsive to electromechanical stimuli;
    a cover positioned on the MEMS structure, wherein the cover is configured to mechanically protect the MEMS structure;
    a bump stop disposed on a substrate wherein the bump stop is configured to stop the MEMS structure from moving beyond a certain point and further configured to stop the MEMS structure from making physical contact with the substrate, and wherein the cover is configured to apply a force to the MEMS structure; and
    a processor configured to measure adhesion force between the MEMS structure and the bump stop when the MEMS structure makes contact with the bump stop and not released, wherein the adhesion force is measured responsive to the force and by measuring output of the sensor.

11. The sensor as described in claim 10, wherein a magnetic material is disposed over the MEMS structure, and wherein a coil is disposed on the cover, and wherein the cover applies the force to the MEMS structure responsive to electromagnetic field created by the coil.

12. The sensor as described in claim 10, wherein a mechanical vibration applies the force to the MEMS structure.

13. The sensor as described in claim 10, wherein the MEMS structure is released from being in contact with the bump stop when the force overcomes the adhesion force.

14. A method comprising:
    applying a voltage to an exterior surface of a cover, wherein the cover is positioned on a microelectromechanical system (MEMS) structure, wherein an interior surface of the cover is within a same housing as the MEMS structure, wherein the cover is configured to mechanically protect the MEMS structure, and wherein the applying the voltage to the exterior surface of the cover moves the MEMS structure;
    increasing the voltage until the MEMS structure makes physical contact with a bump stop and further until it stays in contact with the bump stop and is not released;
    reducing the voltage until the MEMS structure is released from being in physical contact with the bump stop;

measuring output of a sensor comprising the MEMS structure during the application of the voltage, and during the increasing the voltage, and during the reducing of the voltage; and determining adhesion force between the MEMS structure and the bump stop based on the measurement output of the sensor.

15. The method as described in claim 14, wherein the MEMS structure is released from being in contact with the bump stop when a magnitude of the voltage is reduced to overcome the adhesion force.

16. The method as described in claim 14, wherein the applied voltage ranges between 15 V to 75 V.

17. The method as described in claim 14, wherein the voltage is applied to the exterior surface of the cover via a wire bond connected to an electrical connection on the exterior surface of the cover.

18. The method as described in claim 14, wherein the cover comprises vias, wherein the vias are configured to electrically establish a connection from the exterior of the cover to an electrode within an interior surface of the cover to move the MEMS structure in response to the voltage being applied.

* * * * *